United States Patent
Yang et al.

(10) Patent No.: US 11,581,893 B2
(45) Date of Patent: Feb. 14, 2023

(54) HIGH-FREQUENCY HIGH-LINEAR INPUT BUFFER DIFFERENTIAL CIRCUIT

(71) Applicant: Chengdu Sino Microelectronics Technology Co., Ltd., Chengdu (CN)

(72) Inventors: Jinda Yang, Chengdu (CN); Yuanjun Cen, Chengdu (CN); Jian Luo, Chengdu (CN)

(73) Assignee: Chengdu Sino Microelectronics Technology Co., Ltd., Chengdu (CN)

( * ) Notice: Subject to any disclaimer, the term of this patent is extended or adjusted under 35 U.S.C. 154(b) by 0 days.

(21) Appl. No.: 17/399,068

(22) Filed: Aug. 11, 2021

(65) Prior Publication Data

US 2022/0131543 A1 Apr. 28, 2022

(30) Foreign Application Priority Data

Oct. 26, 2020 (CN) .......................... 202011152687.2

(51) Int. Cl.
*H03K 19/0185* (2006.01)
*H03F 3/45* (2006.01)
*H03K 19/0948* (2006.01)

(52) U.S. Cl.
CPC . *H03K 19/018528* (2013.01); *H03F 3/45192* (2013.01); *H03K 19/018578* (2013.01); *H03K 19/0948* (2013.01)

(58) Field of Classification Search
None
See application file for complete search history.

(56) References Cited

U.S. PATENT DOCUMENTS

| 2001/0026192 | A1* | 10/2001 | Yamamoto | H03F 3/45183 330/253 |
| 2012/0294055 | A1* | 11/2012 | Kim | H03F 3/45179 363/127 |
| 2021/0152164 | A1* | 5/2021 | He | H03F 1/3205 |
| 2022/0131502 | A1* | 4/2022 | Xiang | H03F 3/2173 |

OTHER PUBLICATIONS

Siddharth Devarajan et al., A 12-b 10-GS/s Interleaved Pipeline ADC in 28-nm CMOS Technology, IEEE Article, Dec. 2017, vol. 52, No. 12.

* cited by examiner

*Primary Examiner* — Jany Richardson
(74) *Attorney, Agent, or Firm* — Bayramoglu Law Offices LLC

(57) ABSTRACT

A high-frequency high-linear input buffer includes a first MOS transistor, a second MOS transistor, a third MOS transistor, and a signal panning unit. A gate terminal of the first MOS transistor is used as an input terminal of the buffer. A current input terminal of the first MOS transistor is connected to a current output terminal of the second MOS transistor. A current output terminal of the first MOS transistor is connected to a current input terminal of the third MOS transistor. A current input terminal of the second MOS transistor is connected to a gate terminal of the third MOS transistor. An input terminal of the signal panning unit is connected to an input terminal of the buffer. An output terminal of the signal panning unit is connected to a gate terminal of the second MOS transistor. An output terminal of the third MOS transistor is connected to ground.

3 Claims, 3 Drawing Sheets under HIGH-FREQUENCY HIGH-LINEAR INPUT BUFFER DIFFERENTIAL CIRCUIT

CROSS REFERENCE TO THE RELATED APPLICATIONS

This application is based upon and claims priority to Chinese Patent Application No. 202011152687.2, filed on Oct. 26, 2020, the entire contents of which are incorporated herein by reference.

TECHNICAL FIELD

The present invention relates to integrated circuit technologies.

BACKGROUND

At present, one of high-speed high-precision analog to digital converters that are most challenging and difficult to design is a high-speed high-linear input buffer at the front end. Representative companies in the converter field, including ADI and TI in the United States, have their own high-speed high-linear input buffers. And generally, an open-loop source electrode-following structure is adopted for a main circuit.

The high-speed high-linear input buffer is one of core and most critical modules of the high-speed high-precision analog to digital converter, as well as the module that is most challenging and difficult to design. At present, internationally, only ADI and TI in the United States have publicly reported that they have mastered design technologies of a series of high-speed high-linear input buffers, which have been used in several high-speed high-precision analog to digital converters produced by ADI and TI.

The method of improving linearity of the high-frequency high-linear input buffer, in essence, mainly includes:

1. Reducing input nonlinear load.
2. Reducing a channel length modulation effect of the input buffer.
3. Reducing buffer signal current.

FIG. 1 shows an existing input buffer, please refer to the paper A 12-b 10-GS/s Interleaved Pipeline ADC in 28-nm CMOS Technology. VOL. 52, NO. 12, DECEMBER 2017. JSSC.

The operating principle of the source electrode input buffer is: inputting high-frequency signals, following output of the input buffer through a conventional source electrode, and driving a next load. The key to maintaining high-frequency linearity is to connect multiple source electrode following buffers in series to keep a source-drain voltage of a main drive circuit constant, thereby reducing an influence of the channel length modulation effect on output linearity.

In the prior art, only linearity deterioration caused by the second problem is resolved while the first and third problems are not effectively resolved.

SUMMARY

The technical problems to be resolved in the present invention is to provide a high-frequency high-linear input buffer with higher linearity, and a differential circuit composed of high-frequency high-linear input buffers.

A high-frequency high-linear input buffer differential circuit, comprising two high-frequency high-linear input buffers of a same structure, wherein the high-frequency high-linear input buffer comprises a first MOS transistor, a second MOS transistor, a third MOS transistor, and a signal panning unit, a gate terminal of the first MOS transistor is used as an input terminal of the buffer, a current input terminal of the first MOS transistor is connected to a current output terminal of the second MOS transistor, a current output terminal of the first MOS transistor is connected to a current input terminal of the third MOS transistor, a current input terminal of the second MOS transistor is connected to a gate terminal of the third MOS transistor, an input terminal of the signal panning unit is connected to an input terminal of the buffer, an output terminal of the signal panning unit is connected to a gate terminal of the second MOS transistor, an output terminal of the third MOS transistor is connected to ground, and the current input terminal of the second MOS transistor is connected to an active bias current circuit;

an input terminal of a first high-frequency high-linear input buffer is used as a first differential input terminal of the differential circuit, and an output terminal of the first high-frequency high-linear input buffer is used as a first differential output terminal of the differential circuit, an input terminal of a second high-frequency high-linear input buffer is used as a second differential input terminal of the differential circuit, and an output terminal of the second high-frequency high-linear input buffer is used as a second differential output terminal of the differential circuit; and the first differential input terminal is connected to a reference point through a first capacitor, the second differential input terminal is connected to the reference point through a second capacitor, and the reference point is connected to a bias voltage input terminal through a resistor; or the first differential input terminal is connected to a first bias voltage input point through a first capacitor, and the second differential input terminal is connected to a second bias voltage input point through a second capacitor.

the first MOS transistor, the second MOS transistor, and the third MOS transistor are all NMOS transistors, and the signal panning unit is a capacitor.

the active bias current circuit is a resistor with one end connected to a high electrical level.

Input linearity and output linearity are effectively improved in the present invention. In the high-speed high-precision analog to digital converter, one of main dynamic indicators is high-frequency linearity. And the indicator is also a difficulty in the design of the analog to digital converter. A main bottleneck is the input buffer. In the present invention, performance indicators of the high-speed high-precision analog to digital converter can be greatly improved.

DETAILED DESCRIPTION OF THE EMBODIMENTS

Figure 1:
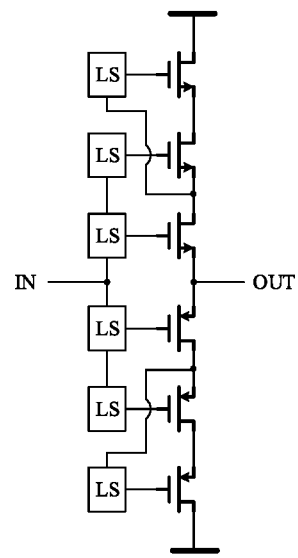
FIG. 1 is a schematic diagram of the prior art.
Figure 2:
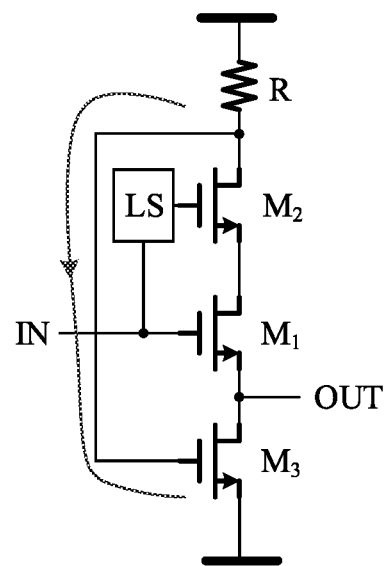
FIG. 2 is a schematic structural diagram of a single-terminal circuit according to the present invention.
Figure 3:
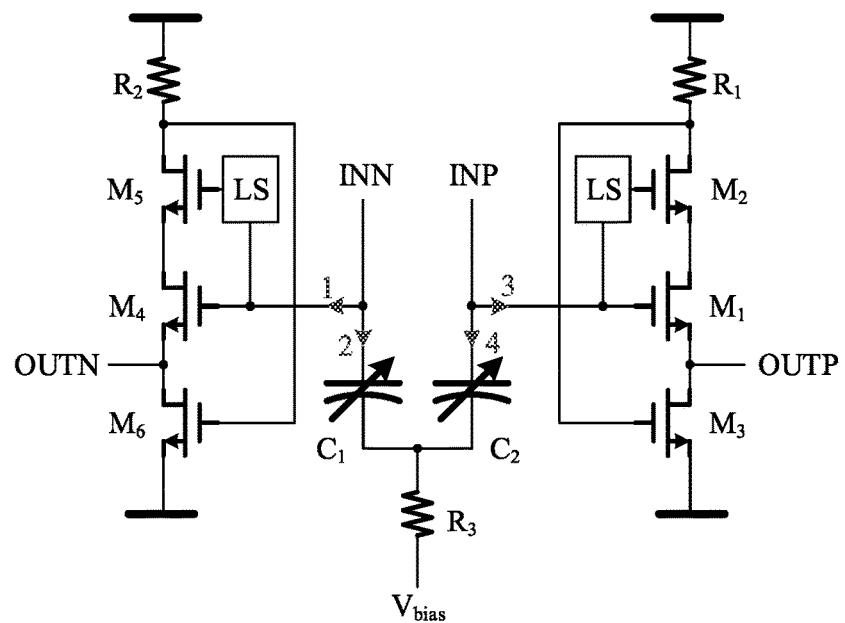
FIG. 3 is a schematic structural diagram of a differential circuit according to the present invention.

Please refer to FIG. 1 to FIG. 3.

For an NMOS transistor, a source terminal is a current output terminal, and a drain terminal is a current input terminal.

For a PMOS transistor, a source terminal is a current input terminal, and a drain terminal is a current output terminal.

As an implementation, FIG. 2 shows a high-frequency high-linear input buffer, including a signal panning unit LS and three NMOS transistors: a first MOS transistor M1, a second MOS transistor M2, and a third MOS transistor M3.

A gate terminal of the first MOS transistor M1 is used as an input terminal of the buffer, and a current output terminal of the first MOS transistor M1 is used as an output terminal of the buffer; and a current input terminal of the first MOS transistor is connected to a current output terminal of the second MOS transistor, the current output terminal of the first MOS transistor is connected to a current input terminal of the third MOS transistor, a current input terminal of the second MOS transistor is connected to a gate terminal of the third MOS transistor, an input terminal of the signal panning unit is connected to an input terminal of the buffer, an output terminal of the signal panning unit is connected to a gate terminal of the second MOS transistor, an output terminal of the third MOS transistor is connected to ground, and the current input terminal of the second MOS transistor is connected to a high-level input terminal through a resistor. A DC blocking capacitor may be used in the signal panning unit LS.

As a main input buffer component, the first MOS transistor M1 converts, according to a source electrode-following principle, an input signal to output, and drives the next load (not shown in the figure).

Mainly according to the source electrode-following principle, after panning the input signal to a voltage through the signal panning unit LS, the second MOS transistor M2 drives a drain electrode of the first MOS transistor M1 through a source electrode of the second MOS transistor M2, to ensure that a fixed voltage will be maintained between the drain electrode and the source electrode of the first MOS transistor M1 when the signal is input, thereby resolving the second problem of the high-frequency high-linear input buffer (channel length modulation).

In a feedback path shown by a curved arrow, a resistor R and the third MOS transistor M3 are mainly used to provide a large driving current for an output load, thereby reducing a signal current of the main input buffer component M1 and resolving the third problem.

Linearity of the feedback path is also taken into account when using the resistor R. The resistor usually has a relatively small voltage coefficient and high linearity, but when the active bias is used, the MOS transistor has a large voltage coefficient and poor nonlinearity.

Figure 4:
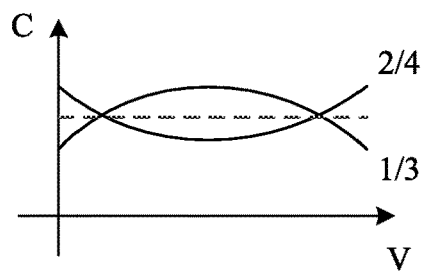
FIG. 4 is a schematic diagram of a differential circuit according to the present invention.

The differential circuit of the present invention is shown in FIG. 3. Two capacitors C1, C2 and resistor R3 are mainly used to resolve the first problem, and nonlinear capacitors of a path 2 and a path 4 are used to offset nonlinear capacitors of a path 1 and a path 3, thereby improving linearity of the entire input load. The basic principle is shown in FIG. 4.

As a first embodiment, referring to FIG. 3, the high-frequency high-linear input buffer differential circuit of the present invention includes two high-frequency high-linear input buffers of a same structure, where the high-frequency high-linear input buffer includes a first MOS transistor, a second MOS transistor, a third MOS transistor, and a signal panning unit, a gate terminal of the first MOS transistor is used as an input terminal of the buffer, a current input terminal of the first MOS transistor is connected to a current output terminal of the second MOS transistor, a current output terminal of the first MOS transistor is connected to a current input terminal of the third MOS transistor, a current input terminal of the second MOS transistor is connected to a gate terminal of the third MOS transistor, an input terminal of the signal panning unit is connected to an input terminal of the buffer, an output terminal of the signal panning unit is connected to a gate terminal of the second MOS transistor, an output terminal of the third MOS transistor is connected to ground, and the current input terminal of the second MOS transistor is connected to a high electrical level through a resistor;

an input terminal of a first high-frequency high-linear input buffer is used as a first differential input terminal of the differential circuit, and an output terminal of the first high-frequency high-linear input buffer is used as a first differential output terminal of the differential circuit, an input terminal of a second high-frequency high-linear input buffer is used as a second differential input terminal of the differential circuit, and an output terminal of the second high-frequency high-linear input buffer is used as a second differential output terminal of the differential circuit; and the first differential input terminal is connected to a reference point through a first capacitor, the second differential input terminal is connected to the reference point through a second capacitor, and the reference point is connected to a bias voltage input terminal through a resistor.

In conclusion, the characteristics of the present invention are summarized as follows: the channel length modulation problem is resolved through source-drain following of M1 and M2, the output signal current of the main buffer is reduced through the feedback path, the input linearity is improved through offset of the nonlinear capacitors (C1 and C2), and bias voltage driving capability is reduced through differential coupling of the capacitor C1 and the capacitor C2.

Figure 5:
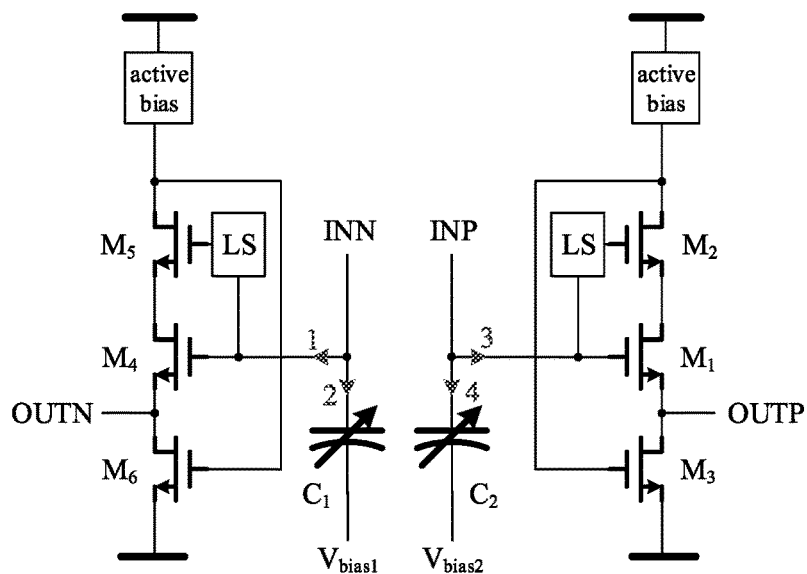
FIG. 5 is a schematic structural diagram of Embodiment 2 according to the present invention.
Figure 6:
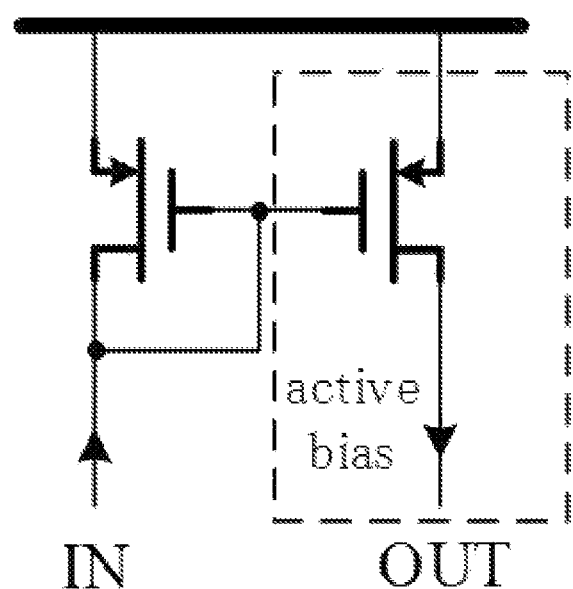
FIG. 6 is a circuit diagram of an active bias current circuit.

FIG. 5 shows a second embodiment: a high-frequency high-linear input buffer differential circuit, including two high-frequency high-linear input buffers of a same structure, where the high-frequency high-linear input buffer includes a first MOS transistor, a second MOS transistor, a third MOS transistor, and a signal panning unit, a gate terminal of the first MOS transistor is used as an input terminal of the buffer, a current input terminal of the first MOS transistor is connected to a current output terminal of the second MOS transistor, a current output terminal of the first MOS transistor is connected to a current input terminal of the third MOS transistor, a current input terminal of the second MOS transistor is connected to a gate terminal of the third MOS transistor, an input terminal of the signal panning unit is connected to an input terminal of the buffer, an output terminal of the signal panning unit is connected to a gate terminal of the second MOS transistor, an output terminal of the third MOS transistor is connected to ground, and the current input terminal of the second MOS transistor is connected to an output point of an active bias current circuit. FIG. 6 shows an example of an active bias current circuit.

An input terminal of a first high-frequency high-linear input buffer is used as a first differential input terminal of the differential circuit, and an output terminal of the first high-frequency high-linear input buffer is used as a first differential output terminal of the differential circuit, an input terminal of a second high-frequency high-linear input buffer is used as a second differential input terminal of the differential circuit, and an output terminal of the second high-frequency high-linear input buffer is used as a second differential output terminal of the differential circuit; and the first differential input terminal is connected to a first bias voltage input point through a first capacitor, and the second differential input terminal is connected to a second bias voltage input point through a second capacitor.

What is claimed is:

1. A high-frequency high-linear input buffer differential circuit, comprising
   two high-frequency high-linear input buffers of a same structure, wherein
   a second high-frequency high-linear input buffer of the two high-frequency high-linear input buffers comprises a first metal oxide semiconductor (MOS) transistor, a second MOS transistor, a third MOS transistor, and a signal panning unit, wherein
      a gate terminal of the first MOS transistor is used as an input terminal of the second high-frequency high-linear input buffer,
      a current input terminal of the first MOS transistor is connected to a current output terminal of the second MOS transistor,
      a current output terminal of the first MOS transistor is connected to a current input terminal of the third MOS transistor, and the current output terminal of the first MOS transistor is used as an output terminal of the second high-frequency high-linear input buffer,
      a current input terminal of the second MOS transistor is connected to a gate terminal of the third MOS transistor,
      an input terminal of the signal panning unit is connected to the input terminal of the second high-frequency high-linear input buffer,
      an output terminal of the signal panning unit is connected to a gate terminal of the second MOS transistor,
      an output terminal of the third MOS transistor is connected to a ground, and
      the current input terminal of the second MOS transistor is connected to an active bias current circuit;
   an input terminal of a first high-frequency high-linear input buffer of the two high-frequency high-linear input buffers is used as a first differential input terminal of the high-frequency high-linear input buffer differential circuit, and an output terminal of the first high-frequency high-linear input buffer is used as a first differential output terminal of the high-frequency high-linear input buffer differential circuit,
   the input terminal of the second high-frequency high-linear input buffer is used as a second differential input terminal of the high-frequency high-linear input buffer differential circuit, and the output terminal of the second high-frequency high-linear input buffer is used as a second differential output terminal of the high-frequency high-linear input buffer differential circuit; and
   the first differential input terminal is connected to a reference point through a first capacitor, the second differential input terminal is connected to the reference point through a second capacitor, and the reference point is connected to a bias voltage input terminal through a first resistor; or
   the first differential input terminal is connected to a first bias voltage input point through the first capacitor, and the second differential input terminal is connected to a second bias voltage input point through the second capacitor.

2. The high-frequency high-linear input buffer differential circuit according to claim 1, wherein
   the first MOS transistor, the second MOS transistor, and the third MOS transistor are N-channel metal oxide semiconductor (NMOS) transistors, and
   the signal panning unit of the second high-frequency high-linear input buffer is a third capacitor, and a signal panning unit of the first high-frequency high-linear input buffer is a fourth capacitor.

3. The high-frequency high-linear input buffer differential circuit according to claim 1, wherein
   the active bias current circuit is a second resistor with one end connected to a high electrical level.

* * * * *